United States Patent
Otremba et al.

(10) Patent No.: US 9,515,060 B2
(45) Date of Patent: Dec. 6, 2016

(54) MULTI-CHIP SEMICONDUCTOR POWER DEVICE

(71) Applicant: Infineon Technologies Austria AG, Villach (AT)

(72) Inventors: Ralf Otremba, Kaufbeuren (DE); Josef Hoeglauer, Heimstetten (DE); Xaver Schloegel, Sachsenkam (DE); Chooi Mei Chong, Melaka (MY)

(73) Assignee: Infineon Technologies Austria AG, Villach (AT)

( * ) Notice: Subject to any disclaimer, the term of this patent is extended or adjusted under 35 U.S.C. 154(b) by 43 days.

(21) Appl. No.: 13/847,681

(22) Filed: Mar. 20, 2013

(65) Prior Publication Data

US 2014/0284777 A1 Sep. 25, 2014

(51) Int. Cl.
*H01L 25/18* (2006.01)
*H01L 23/492* (2006.01)
(Continued)

(52) U.S. Cl.
CPC ......... *H01L 25/18* (2013.01); *H01L 23/49513* (2013.01); *H01L 23/49562* (2013.01); *H01L 23/49575* (2013.01); *H01L 24/40* (2013.01); *H01L 24/84* (2013.01); *H01L 25/50* (2013.01); *H01L 23/3107* (2013.01); *H01L 24/29* (2013.01); *H01L 24/32* (2013.01); *H01L 24/48* (2013.01); *H01L 24/73* (2013.01); *H01L 24/83* (2013.01); *H01L 24/92* (2013.01); *H01L 2224/291* (2013.01); *H01L 2224/2919* (2013.01); *H01L 2224/32245* (2013.01); *H01L 2224/33181* (2013.01); *H01L 2224/40095* (2013.01); *H01L 2224/40137* (2013.01); *H01L 2224/40247* (2013.01); *H01L 2224/48091* (2013.01); *H01L 2224/48137* (2013.01); *H01L 2224/48145* (2013.01); *H01L 2224/48247* (2013.01); *H01L 2224/73263* (2013.01); *H01L 2224/73265* (2013.01); *H01L 2224/8321* (2013.01); *H01L 2224/8384* (2013.01); *H01L 2224/83815* (2013.01); *H01L 2224/92246* (2013.01);
(Continued)

(58) Field of Classification Search
CPC .................. H01L 2224/32145; H01L 25/0652; H01L 25/0657; H01L 2924/14; H01L 23/49575; H01L 2224/32245; H01L 2224/48145
USPC ................. 257/723, 777, E25.013, E25.011, 676,257/724
See application file for complete search history.

(56) References Cited

U.S. PATENT DOCUMENTS 7,612,459 B2   11/2009   Zingher et al.
7,750,451 B2 *  7/2010   Camacho et al. ........... 257/686
(Continued)

FOREIGN PATENT DOCUMENTS

CN   102760724 A   10/2012
DE   10301091 A1   7/2004
(Continued)

*Primary Examiner* — Marcos D Pizarro
(74) *Attorney, Agent, or Firm* — Murphy, Bilak & Homiller, PLLC

(57) ABSTRACT

A semiconductor device includes a first semiconductor power chip mounted over a first carrier and a second semiconductor power chip mounted over a second carrier. The semiconductor device further includes a contact clip mounted over the first semiconductor power chip and on the second semiconductor power chip. A semiconductor logic chip is mounted over the contact clip.

16 Claims, 7 Drawing Sheets

(51) Int. Cl.
*H01L 23/495* (2006.01)
*H01L 25/00* (2006.01)
H01L 23/31 (2006.01)
H01L 23/00 (2006.01)

(52) U.S. Cl.
CPC .................. *H01L 2924/014* (2013.01); *H01L 2924/07802* (2013.01); *H01L 2924/1305* (2013.01); *H01L 2924/1306* (2013.01); *H01L 2924/13055* (2013.01); *H01L 2924/13062* (2013.01); *H01L 2924/13091* (2013.01); *H01L 2924/1431* (2013.01); *H01L 2924/181* (2013.01)

(56) References Cited

U.S. PATENT DOCUMENTS

| | | | |
|---|---|---|---|
| 7,800,208 B2 | 9/2010 | Otremba | |
| 7,804,131 B2 | 9/2010 | Cheah et al. | |
| 8,569,884 B2 * | 10/2013 | Haba et al. | 257/735 |
| 8,704,384 B2 * | 4/2014 | Wu et al. | 257/782 |
| 2006/0208348 A1 | 9/2006 | Ohsaka et al. | |
| 2013/0113114 A1 * | 5/2013 | Hosseini et al. | 257/777 |

FOREIGN PATENT DOCUMENTS

| | | | |
|---|---|---|---|
| DE | 102008027703 A1 | 1/2009 | |
| DE | 102008051965 A1 | 7/2009 | |

* cited by examiner

A-A

B-B

МULTI-CHIP SEMICONDUCTOR POWER DEVICE

TECHNICAL FIELD

This invention relates to the technique of packaging, and in particular to the technique of packaging multiple semiconductor chips in a stacked configuration for power applications.

BACKGROUND

Semiconductor device manufacturers are constantly striving to increase the performance of their products, while decreasing their cost of manufacture. A cost intensive area in the manufacture of semiconductor devices is packaging the semiconductor chips. As those skilled in the art are aware, integrated circuits are fabricated on wafers, which are then singulated to produce semiconductor chips. Subsequently, the semiconductor chips may be mounted on electrically conductive carriers, such as, e.g., leadframes. Packaging methods providing small component sizes at low expenses are desirable.

For these and other reasons, there is a need for the present invention.

SUMMARY

According to an embodiment of a semiconductor device, the semiconductor device comprises a first carrier having a mounting surface, a first semiconductor power chip mounted over the mounting surface of the first carrier and having a first surface facing away from the first carrier, a second carrier having a mounting surface, and a second semiconductor power chip mounted over the mounting surface of the second carrier and having a first surface facing away from the second carrier. A connection element has a first surface connected to the first surface of the first semiconductor power chip and a mounting surface facing away from the first surface. A third semiconductor chip is mounted over the mounting surface of the connection element.

According to another embodiment of a semiconductor device, the semiconductor device comprises a first semiconductor power chip mounted over a first carrier, a second semiconductor power chip mounted over a second carrier, a contact clip mounted over the first semiconductor power chip and over the second semiconductor power chip, and a semiconductor logic chip mounted over the contact clip.

According to an embodiment of a method of manufacturing a semiconductor device, the method comprises: mounting a first semiconductor power chip on a first carrier; mounting a second semiconductor power chip on a second carrier; bonding a contact clip to the first semiconductor power chip and to the second semiconductor power chip; and mounting a third semiconductor chip over the contact clip.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
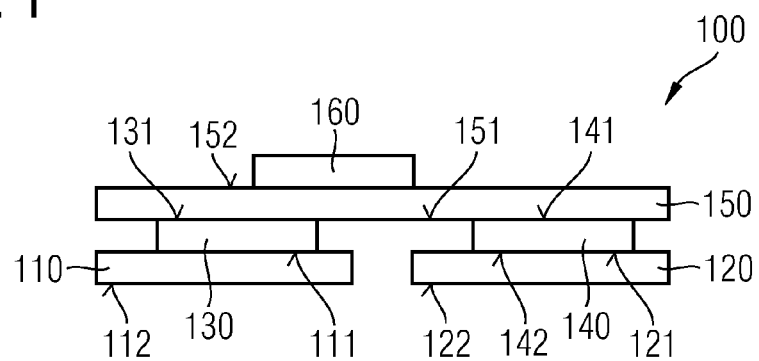
FIG. 1 schematically illustrates a cross-sectional view of an exemplary power semiconductor device.

In the following detailed description, reference is made to the accompanying drawings, which form a part thereof, and in which is shown byway of illustration specific embodiments in which the invention may be practiced. In this regard, directional terminology, such as "top", "bottom", "front", "back", "upper", "lower", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

As employed in this specification, the terms "coupled" and/or "connected" are not meant to mean in general that elements must be directly coupled or connected together. Intervening elements may be provided between the "coupled" or "connected" elements. However, although not restricted to that meaning, the terms "coupled" and/or "connected" may also be understood to optionally disclose an aspect in which the elements are directly coupled or connected together without intervening elements provided between the "coupled" or "connected" elements.

Devices containing two or more power semiconductor chips are described herein. In particular, one or more power semiconductor chips having a vertical structure may be involved, that is to say that the semiconductor chips may be fabricated in such a way that electric currents can flow in a direction perpendicular to the main surfaces of the semiconductor chips. A semiconductor chip having a vertical structure has electrodes on its two main surfaces, that is to say on its top side and bottom side.

The power semiconductor chips may be manufactured from specific semiconductor material such as, for example, Si, SiC, SiGe, GaAs, GaN, etc, and, furthermore, may contain inorganic and/or organic materials that are not semiconductors. The power semiconductor chips may be of different types and may be manufactured by different technologies.

Furthermore, the electronic devices described herein may include one or more logic integrated circuit to control the power semiconductor chips. The logic integrated circuit may include one or more driver circuits to drive one or more of the power semiconductor chips. The logic integrated circuit may e.g. be a microcontroller including, e.g., memory circuits, level shifters, etc.

The power semiconductor chips may have electrodes (chip pads) which allow electrical contact to be made with the integrated circuits in the semiconductor chips. The electrodes may include one or more metal layers which are applied to the semiconductor material of the semiconductor chips. The metal layers may be manufactured with any desired geometric shape and any desired material composition. The metal layers may, for example, be in the form of a layer or land covering an area. By way of example, any desired metal capable of forming a solder bond or diffusion solder bond, for example Cu, Ni, NiSn, Au, Ag, Pt, Pd, In, Sn, and an alloy of one or more of these metals may be used as the material. The metal layers need not be homogenous or manufactured from just one material, that is to say various compositions and concentrations of the materials contained in the metal layers are possible.

Vertical power semiconductor chips may, for example, be configured as power MOSFETs (Metal Oxide Semiconductor Field Effect Transistors), IGBTs (Insulated Gate Bipolar Transistors), JFETs (Junction Gate Field Effect Transistors), power bipolar transistors or power diodes. By way of example, the source contact electrode and the gate contact electrode of a power MOSFET may be situated on one main surface, while the drain contact electrode of the power MOSFET may be arranged on the other main surface.

Two or more semiconductor power chips are mounted over carriers. In one embodiment, the carriers may each be a metal plate or sheet such as, e.g., a die pad of a leadframe. The metal plate or sheet may be made of any metal or metal alloy, e.g. copper or copper alloy. In other embodiments, the chip carriers may be made of plastics or ceramics. For instance, the chip carriers may comprise a layer of plastics coated with a metal layer. By way of example, such chip carriers may be a single-layer PCB or a multi-layer PCB. The PCB may have at least one insulating layer and a structured metal foil layer attached to the insulating layer. The insulating layer may comprise or be made on the basis of epoxy resin, polytetrafluoroethylene, aramid fibers or carbon fibers and may include reinforcement means such as fiber mats, for example glass or carbon fibers. In other embodiments, the device carrier may comprise a plate of ceramics coated with a metal layer, e.g. a metal bonded ceramics substrate. By way of example, the device carrier may be a DCB (direct copper bonded) ceramics substrate.

The two or more semiconductor power chips may at least partly be surrounded or embedded in at least one electrically insulating material. The electrically insulating material forms an encapsulation body. The encapsulation body may comprise or be made of a mold material. Various techniques may be employed to form the encapsulation body of the mold material, for example compression molding, injection molding, powder molding or liquid molding. Further, the encapsulation body may have the shape of a piece of a layer, e.g. a piece of a sheet or foil that is laminated on top of the power semiconductor chip(s) and the carrier(s). The encapsulation body may form part of the periphery of the package, i.e. may at least partly define the shape of the semiconductor device.

The electrically insulating material may comprise or be made of a thermoset material or a thermoplastic material. A thermoset material may e.g. be made on the basis of an epoxy resin. A thermoplastic material may e.g. comprise one or more materials of the group of polyetherimide (PEI), polyether-sulfone (PES) polyphenylene-sulfide (PPS) or polyamide-imide (PAI). Thermoplastic materials melt by application of pressure and heat during molding or lamination and (reversibly) harden upon cooling and pressure release.

The electrically insulating material forming the encapsulation body may comprise or be made of a polymer material. The electrically insulating material may comprise at least one of a filled or unfilled mold material, a filled or unfilled thermoplastic material, a filled or unfilled thermoset material, a filled or unfilled laminate, a fiber-reinforced laminate, a fiber-reinforced polymer laminate, and a fiber-reinforced polymer laminate with filler particles.

In some embodiments, the electrically insulating material may be a laminate, e.g. a polymer foil or sheet. Heat and pressure may be applied for a time suitable to attach the polymer foil or sheet to the underlying structure. During lamination, the electrically insulating foil or sheet is capable of flowing (i.e. is in a plastic state), resulting in that gaps between the power semiconductor chips and/or other topological structures on the chip carriers are filled with the polymer material of the electrically insulating foil or sheet. The electrically insulating foil or sheet may comprise or be made of any appropriate thermoplastic or thermoset material. In one embodiment, the insulating foil or sheet may comprise or be made of a prepreg (short for pre-impregnated fibers), that is e.g. made of a combination of a fiber mat, for example glass or carbon fibers, and a resin, for example a thermoset or thermoplastic material. Prepreg materials are known in the art and are typically used to manufacture PCBs (printed circuit boards).

A connection element such as, e.g., a contact clip is provided to electrically connect a load electrode of the first semiconductor power chip to a load electrode of the second semiconductor power chip. The connection element may have an upper mounting surface facing away from the first and second semiconductor power chips and configured to serve as a mounting surface for at least one logic semiconductor chip.

A variety of different types of electronic devices may be designed to use a contact clip as described herein or may be manufactured by the techniques described herein. By way of example, an electronic device in accordance with the disclosure may constitute a power supply containing two or more power semiconductor chips, e.g. MOSFETs, and one or more logic integrated circuits. For instance, an electronic device disclosed herein may comprise a half-bridge circuit including a high side transistor, a low side transistor and a logic integrated circuit chip. The logic integrated circuit chip may, optionally, include one or a plurality of transistor driver circuitry.

A half-bridge circuit as disclosed herein may, e.g., be implemented in an electronic circuit for converting DC or AC voltages into DC voltages, so-called DC-DC converters and AC-DC converters, respectively. DC-DC converters may be used to convert a DC input voltage provided by a battery or rechargeable battery into a DC output voltage matched to the demands of electronic circuits connected downstream. By way of example, a DC-DC converter described herein may be a buck converter or down-converter. AC-DC converters may be used to convert an AC input voltage provided by, e.g., a high voltage AC power network into a DC output voltage matched to the demands of electronic circuits connected downstream.

FIG. 1 illustrates a cross-sectional view of an exemplary semiconductor device 100. The semiconductor device 100 may comprise a first carrier 110, a second carrier 120, a first semiconductor power chip 130, a second semiconductor power chip 140, an electrically conducting connection element 150, referred to as contact clip 150 in the following, and a third semiconductor chip 160. The third semiconductor chip 160 is not a power chip. It may be, e.g., a logic integrated circuit configured to control one or both of the first semiconductor power chip 130 and the second semiconductor power chip 140.

The first carrier 110 and the second carrier 120 may each be made of a flat metal plate, e.g., a die pad of a leadframe. The first carrier 110 and the second carrier 120 may be arranged side-by-side to each other. The first carrier 110 and the second carrier 120 may be disconnected or insular. Thus, there is, e.g., no direct electrical connection between the first carrier 110 and the second carrier 120.

A bottom surface 112 of the first carrier 110 and a bottom surface 122 of the second carrier 120 may form external contact pads of the semiconductor device 100 configured to be connected to an external application such as, e.g., an application board (not shown). By way of example, the bottom surface 112 and the bottom surface 122 may be coplanar and may, e.g., define a mounting surface of the semiconductor device 100.

The first carrier 110 has a mounting surface 111 and the second carrier 120 has a mounting surface 121. The first semiconductor power chip 130 may be mounted with its bottom surface facing the first carrier 110 on the mounting surface 111 thereof. The second semiconductor power chip 140 may be mounted with its bottom surface facing the second carrier 120 on the mounting surface 121 thereof.

The mounting surface 111 of the first carrier 110 and the mounting surface 121 of the second carrier 120 may be coplanar. That is, the first semiconductor power chip 130 and the second semiconductor power chip 140 may, e.g., be arranged in essentially the same device plane (referred to in the following as the "power plane") within the semiconductor device 100.

The contact clip 150 has a bottom surface 151 facing the first semiconductor power chip 130 and the second semiconductor power chip 140. More specifically, the first semiconductor power chip 130 may have a first surface 131 facing away from the first carrier 110 and being bonded to the bottom surface 151 of the contact clip 150, and the second semiconductor power chip 140 may have a first surface 141 facing away from the second carrier 120 and being bonded to the bottom surface 151 of the contact clip 150.

The contact clip 150 may have a mounting surface 152 opposite to the bottom surface 151. The third semiconductor chip 160 is mounted over the mounting surface 152 of the contact clip 150. Thus, the third semiconductor chip 160 is arranged in a device plane (referred to in the following as the "logic plane") which is arranged over the "power plane" defined by semiconductor power chips 130, 140. The two planes may be spaced apart by at least the contact clip 150 extending between the "power plane" and the "logic plane".

It is to be noted that one or a plurality of third semiconductor chips, e.g. logic chips 160, may be arranged on the contact clip 150 in the "logic plane". In some embodiments no semiconductor power chip is arranged on the contact clip 150 or in the "logic plane". On the other hand, in some embodiments no semiconductor logic chip is arranged in the "power plane."

Generally speaking, in some embodiments the "power plane" of the semiconductor device 100 may exclusively contain semiconductor power chips. Further, in some embodiments the "logic plane" of semiconductor device 100 may exclusively contain semiconductor logic chips. That way, it may be guaranteed that logic semiconductor chips 160 are geometrically and thermally separated by the contact clip 150 from the semiconductor power chips 130, 140. As heat is mainly generated in the semiconductor power chips 130, 140 and heat transfer is most effectively performed via the first carrier 110 and the second carrier 120 to e.g. an application board (not shown), a highly effective thermal coupling of the first and second semiconductor power chips 130, 140 to the environment is obtained. On the other hand, the third semiconductor chip 160, which may be a logic semiconductor chip, is thermally separated or isolated by the contact clip 150 from the "power plane". As logic semiconductor chips are typically more sensitive to high temperature exposure than power semiconductor chips, the separation of power chips and logic chips into two distinct planes and, e.g., the thermal decoupling of these planes by the contact clip 150 provides for an effective packaging concept for power applications with a view to high thermal robustness and small package size.

Further, as known in the art, the maximum load, the performance and the lifetime of a semiconductor power device 100 critically depend on the operational temperature of the semiconductor power chips 130, 140 contained in the semiconductor device 100. For that reason, the build-up concept explained above and exemplified e.g. by FIG. 1 may improve the maximum load, the performance and the lifetime of the semiconductor device 100.

Figure 2:
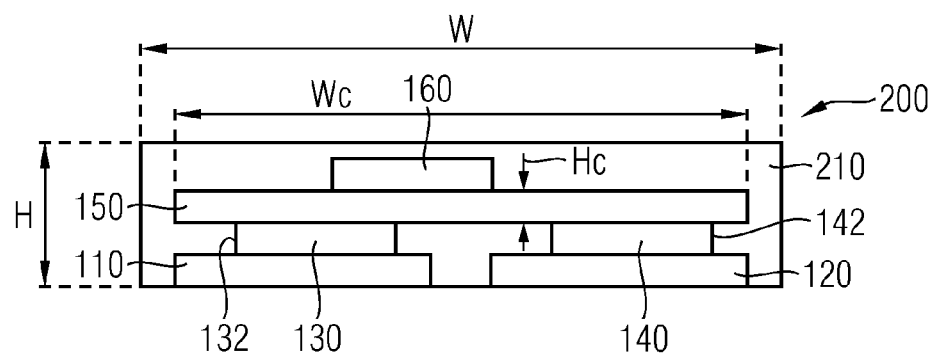
FIG. 2 schematically illustrates a cross-sectional view of an exemplary power semiconductor device.

FIG. 2 illustrates a semiconductor device 200 having, e.g., the same configuration as semiconductor device 100. However, the semiconductor device 200 may additionally comprise an electrically insulating material, e.g. a mold material, forming an encapsulation body 210. The encapsulation body 210 may embed the first and second carriers 110, 120, the first and second semiconductor power chips 130, 140, the contact clip 150 and the third semiconductor chip 160.

By way of example, as illustrated in FIG. 2, the semiconductor device 200 may have a leadless package. The semiconductor device 200 may have a lateral dimensions or width W in a range between e.g. 5-15 mm, more specifically between e.g. 7-13 mm. The semiconductor device 200 may have a vertical dimension or height H in a range between e.g. 0.5-5 mm, more particularly between 1-2 mm. The contact clip 150 may e.g. protrude in at least one lateral dimension over the laterally outer outline 132 of the first semiconductor chip 130 or the laterally outer outline 142 of the second semiconductor chip 140 or, as illustrated in FIGS. 1 and 2, over the laterally outer outlines 132, 142 of both the first and second semiconductor chips 130, 140. The contact clip 150 may have a lateral extension We greater than, e.g., 60%, 70%, 80%, 90% of W. The contact clip 150 may have a vertical dimension Hc in a range between e.g. 0.1-1.0 mm, in particular between e.g. 0.15-3 mm. The vertical dimension of the first carrier 110 and the vertical dimension second carrier 120 may e.g. be equal. The vertical dimension of the first carrier 110 and/or the vertical dimension of the second carrier 120 may be equal to Hc within a tolerance of equal to or less than e.g. ±0.2 mm or ±0.1 mm.

The description in conjunction with FIGS. 1 and 2 may be applied to all embodiments described herein. In particular, the dimensional quantities set out above are applicable to other embodiments.

In FIGS. 1 and 2 a so-called half-bridge circuit may be implemented in semiconductor power devices 100, 200. The first semiconductor chip 130 may form the low side power switch and the second semiconductor chip 140 may form the high side power switch of the half-bridge. The third semiconductor chip 160, e.g. a logic integrated circuit, may control the gate electrodes (not illustrated) of the low side power semiconductor chip 130 and the high side power semiconductor chip 140, respectively.

The first semiconductor power chip 130 and/or the second semiconductor power chip 140 may, e.g., be MOSFETs. The source electrode of the high side second power semiconductor chip 140 may be connected to the contact clip 150. The contact clip 150 may be connected to the drain electrode of the low side first semiconductor power chip 130. The source electrode of the low side first semiconductor power chip 130 may be connected to the first carrier 110. Thus, the low side first semiconductor power chip 130 may be arranged in semiconductor device 100, 200 in a source-down orientation. In contrast, the high side second semiconductor power chip 140 may be oriented in a source-up orientation, i.e. its drain electrode may be connected to the second carrier 120.

Figure 3:
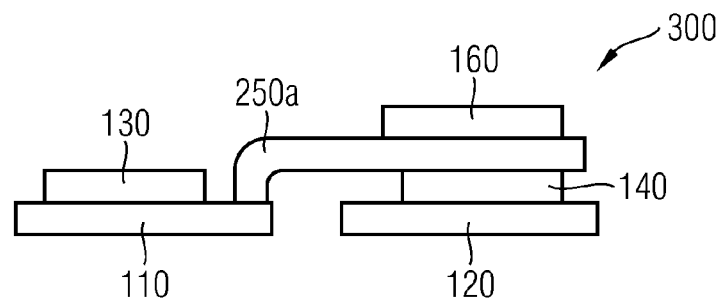
FIG. 3 schematically illustrates a cross-sectional view of an exemplary power semiconductor device.

FIG. 3 illustrates a power semiconductor device 300. The power semiconductor device 300 may be similar to power semiconductor device 100 except that contact clip 250 is bonded to the first carrier 110 rather than to the first semiconductor chip 130. To that end, the contact clip 250 may be provided with e.g. a bent portion 250a or a protrusion as illustrated in FIG. 3.

In the power semiconductor device 300 the low side first semiconductor power chip 130 may be arranged on the first carrier 110 in a source-up orientation and the high side second semiconductor power chip 140 may be arranged on the second carrier 120 also in a source-up orientation.

Similar as described in conjunction with FIGS. 1 and 2, the third semiconductor chip 160 is arranged above the contact clip 250 and the first semiconductor chip 130 and the second semiconductor chip 140 are arranged in a plane below the main extension of the contact clip 250. To avoid reiteration, reference is made to the corresponding description above.

Figure 4:
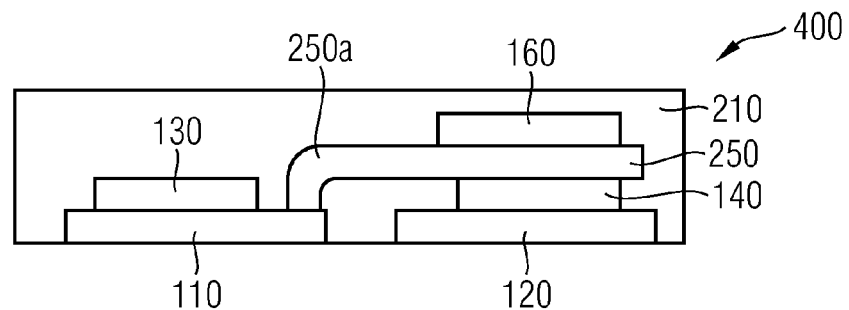
FIG. 4 schematically illustrates a cross-sectional view of an exemplary power semiconductor device.

FIG. 4 illustrates an exemplary power semiconductor device 400. The power semiconductor device 400 is similar to power semiconductor device 300 except that an electrically insulating material 210, e.g. mold material, is applied as described in conjunction with FIG. 2. To avoid reiteration, reference is made to the corresponding description of FIG. 2.

Figure 5:
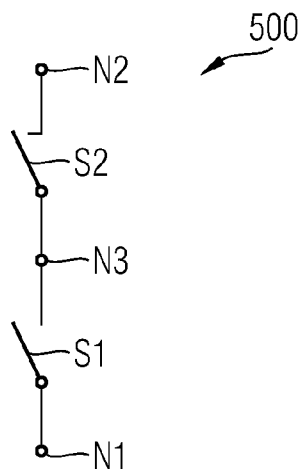
FIG. 5 illustrates a basic circuit diagram of a half-bridge power semiconductor device.

As already mentioned, the semiconductor devices described herein may, for example, be used as half-bridges. A basic circuit of a half bridge 500 arranged between two nodes N1 and N2 is shown in FIG. 5. The half bridge 500 comprises two switches S1 and S2 connected in series. This first semiconductor power chip 130 may be implemented as low side switch S1 and the second semiconductor power chip 140 may be implemented as high side switch S2. Then, compared to the semiconductor devices 100-400 shown in FIGS. 1-4, the node N1 may be the source electrode of the first semiconductor power chip 130, the node N2 may be the drain electrode of the second semiconductor power chip 140 and the node N3 arranged between the two switches S1 and S2 may be the contact clip 150.

Voltages applied between node N1 and N2 may be equal or greater than 30V, 50V, 100V, 300V, 500V, 1000V. In particular, voltages applied between nodes N1 and N2 may be in a range between e.g. 30-150 V if, the power semiconductor device 500 is, e.g., a DC-DC converter. Further, if the power semiconductor device 500 is an AC-DC converter, the voltages applied between node N1 and N2 may be in a range between, e.g., 300-1000 V.

Figure 6:
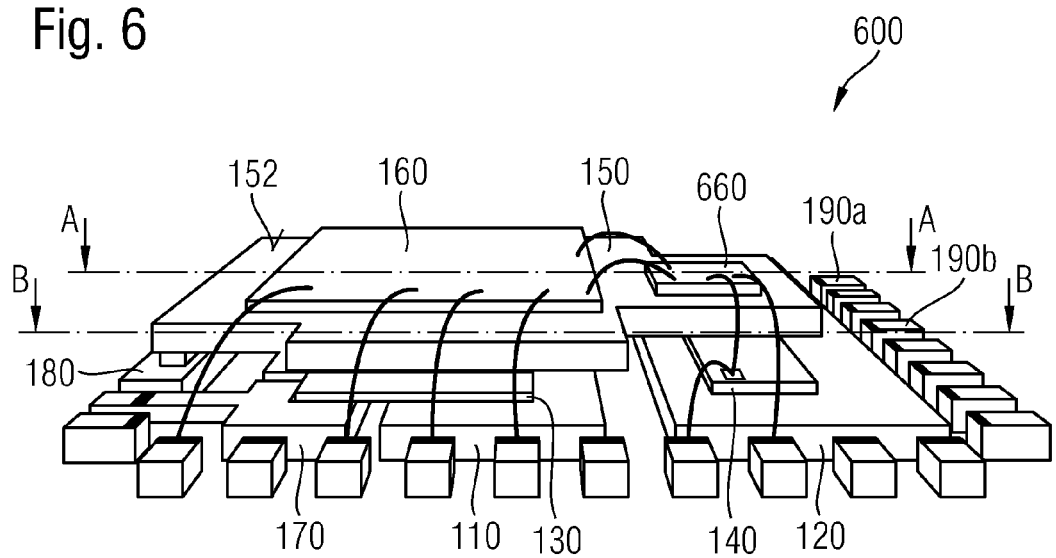
FIG. 6 schematically illustrates a perspective view of an exemplary semiconductor power device.
Figure 7:
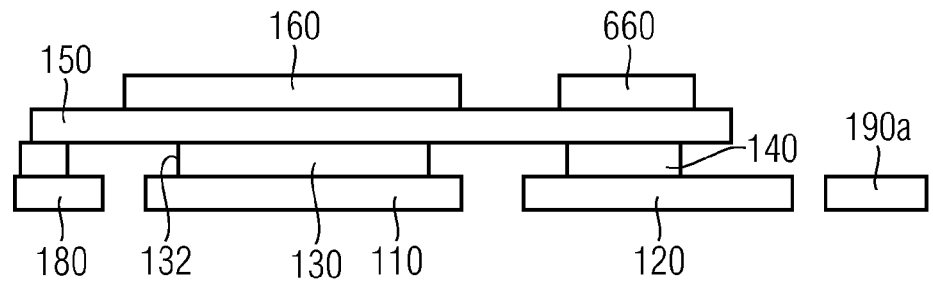
FIG. 7 schematically illustrates a cross-sectional view of the power semiconductor device shown in FIG. 6 along line A-A.
Figure 8:
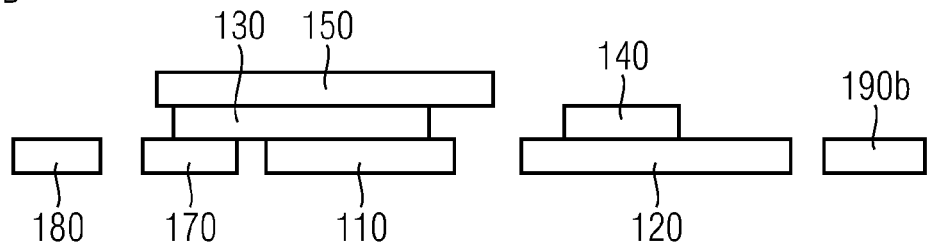
FIG. 8 schematically illustrates a cross-sectional view of the power semiconductor device shown in FIG. 6 along line B-B.

FIGS. 6-8 illustrate, by way of example, a power semiconductor device 600. Power semiconductor device 600 may e.g. also be implemented as a DC-DC converter, an AC-DC converter, or another power supply. Further, all concepts and details of the power semiconductor devices 100 and 200, as explained above in conjunction with FIGS. 1 and 2, may be applied to power semiconductor device 600, and reference is made to the disclosure herein to avoid reiteration.

More specifically, power semiconductor device 600 comprises the first carrier 110, the second carrier 120, the first semiconductor chip 130, the second semiconductor chip 140, the contact clip 150 and the third semiconductor chip 160 in an arrangement as exemplified above. Further, the power semiconductor device 600 may comprise a third carrier 170 which is arranged next to the first carrier 110. A chip electrode such as, e.g., the gate electrode of the first semiconductor chip 130 may be connected to the third carrier 170.

Further, the power semiconductor device 600 may comprise a fourth semiconductor chip 660. The fourth semiconductor chip 660 may be mounted over or on the mounting surface 152 of the contact clip 150. The fourth semiconductor chip 660 may e.g. comprise one or two gate drivers, as will be explained in more detail in conjunction with FIG. 9. It is also possible that the gate drivers to drive the gates of the first semiconductor power chip 130 and the second semiconductor power chip 140 are integrated in the third semiconductor chip 160, which comprises the logic to control the gate drivers.

As apparent in FIG. 7, the contact clip 150 may extend in a lateral direction beyond the outer outline 132 of the first semiconductor power chip 130 and may be bonded to a fourth carrier 180. The fourth carrier 180 may serve as a carrier only for the contact clip 150 and, e.g., not for a semiconductor power chip 130, 140. The first, second, third and fourth carriers 110, 120, 170, 180 may essentially be coplanar. They may e.g. form external terminals of the power semiconductor device 600. More specifically, the carriers 110, 120, 170, 180 may, e.g., be exposed at the bottom of the power semiconductor device 600.

Further, as it is apparent in FIGS. 6-8, a number of terminal pads, including terminal pads 190a, 190b, may be arranged at the periphery of the power semiconductor device 600. The terminal pads 190a, 190b may be connected via e.g. bond wires to electrodes of the third semiconductor chip 160 and/or to electrodes of the fourth semiconductor chip 660. Further, they may be connected via e.g. bond wires to e.g. a gate electrode of the first semiconductor power chip 130 and/or to a gate electrode of the second semiconductor power chip 140. Bond wires may also be used to electrically connect the fourth semiconductor chip 660 (or the third semiconductor chip 160) to the first semiconductor power chip 110 or to the second semiconductor power chip 120, e.g. to the gate electrodes thereof.

The third semiconductor chip 160 and the fourth semiconductor chip 660 of the "logic plane" may be electrically insulated from the contact clip 150 by an insulating layer (not shown) arranged between the mounting surface 152 of the contact clip 150 and the bottom surfaces of the third semiconductor chip 160 and/or the fourth semiconductor chip 660. The insulating layer may comprise or be made of e.g. a polymer material. The insulating layer may have a dielectric strength greater than e.g. 100V, 500V, 1000V or even 10 kV. That way, the insulating layer may serve to electrically isolate the "logic plane" against the "power plane."

Figure 9:
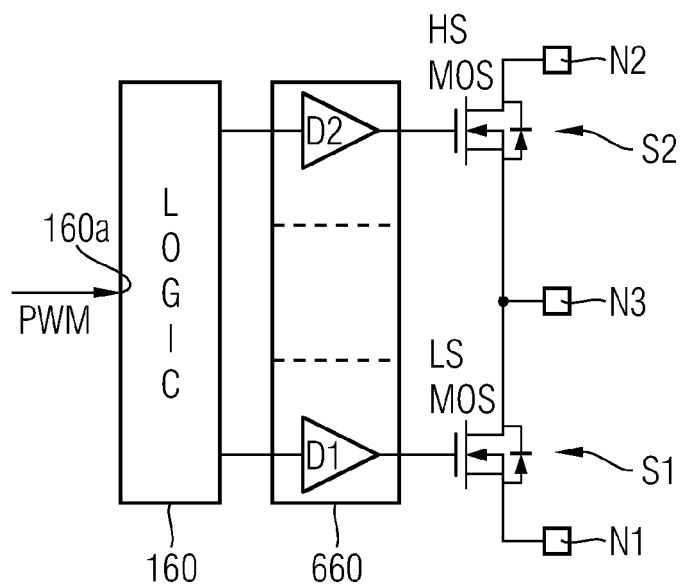
FIG. 9 illustrates a basic circuit diagram of a half-bridge power semiconductor device including logic circuitry and driver circuitry.

FIG. 9 is an exemplary, more detailed illustration of the circuitry shown in FIG. 5 and applicable to the power semiconductor devices 100-600 described herein. As explained above, the switch S1 may be implemented by a low side (LS) MOSFET and switch S2 may be implemented by high side (HS) MOSFET. The gate of LS MOSFET S1 is driven by gate driver D1 and the gate of HS MOSFET S2 is driven by gate driver D2. Gate drivers D1 and D2 are controlled by logic, which may be implemented in the third semiconductor chip 160. The third semiconductor chip 160 may have an input 160a receiving, e.g., a PWM (Pulse-Width Modulated) signal.

By way of example, gate drivers D1 and D2 may be implemented in one semiconductor chip, e.g. the fourth semiconductor chip 660. In other embodiments the gate driver D1 is implemented in a single semiconductor chip and the gate driver D2 is implemented in a single semiconductor chip, resulting in that the "logic plane" may comprise at least three semiconductor chips (one logic chip, two gate driver chips). Further, it is also possible that the gate drivers D1 and D2 are integrated in the third semiconductor chip 160 which implements the logic. In this case, only one semiconductor chip, i.e. the third semiconductor chip 160, may be arranged over and may, e.g., be bonded to the mounting surface 152 of the contact clip 150, i.e. may be contained in the "logic plane".

Figure 10A:
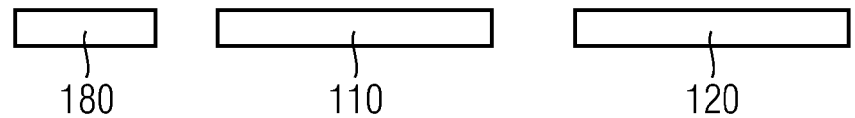
FIGS. 10A-10I schematically illustrate cross-sectional views of an exemplary process of a method of packaging a semiconductor chip.
Figure 10B:
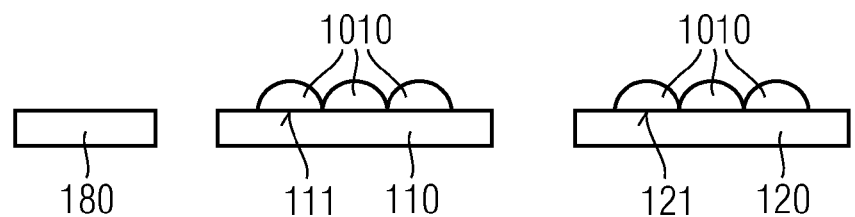
Figure 10C:
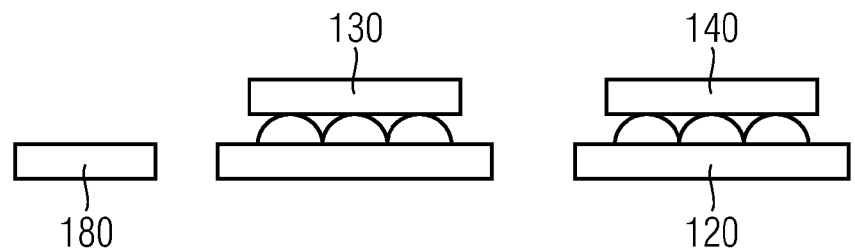
Figure 10D:
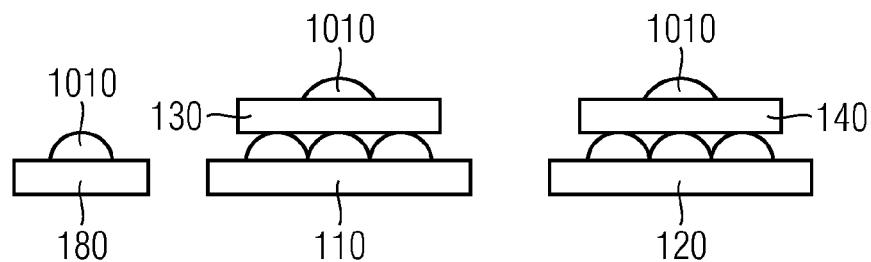
Figure 10E:
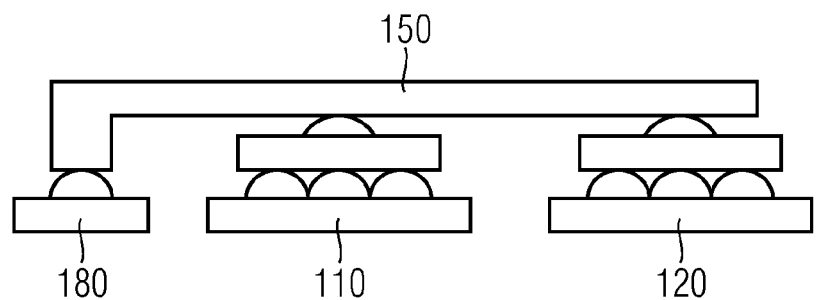
Figure 10F:
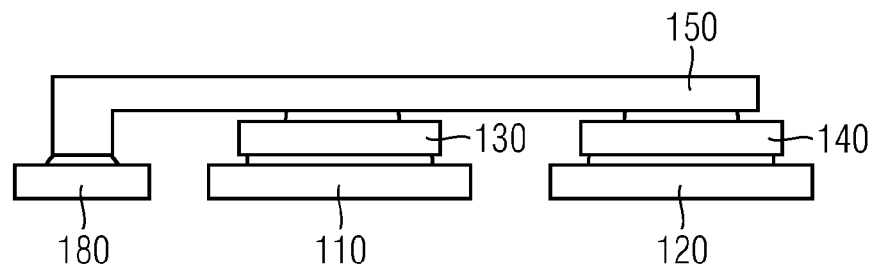
Figure 10G:
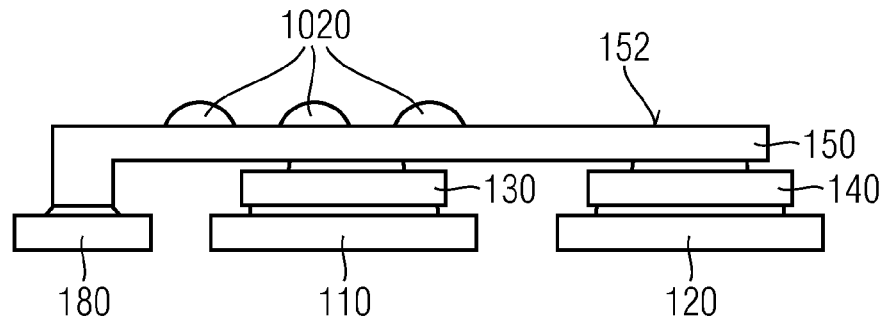
Figure 10H:
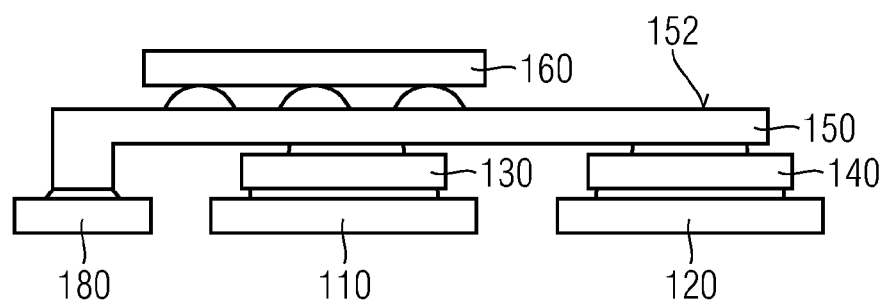
Figure 10I:
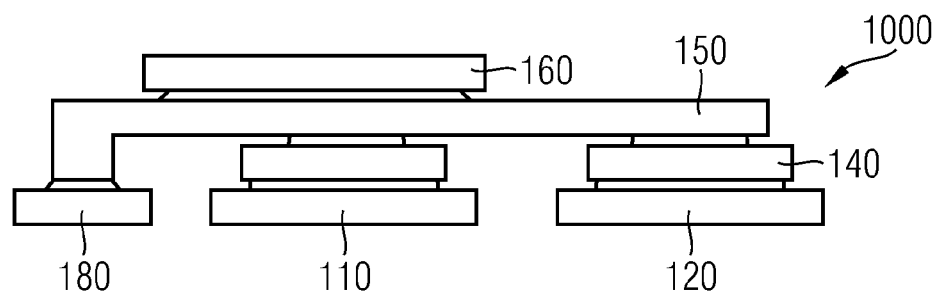

FIGS. 10A-10I illustrate, by way of example, stages of an exemplary method of manufacturing a semiconductor power device 1000. The semiconductor power device 1000, as shown in FIG. 10I, is similar to the semiconductor power devices 100-600, and reference is made to the corresponding description herein in order to avoid reiteration.

FIG. 10A illustrates providing the first carrier 110, the second carrier 120 and, e.g., the fourth carrier 180. As mentioned above, all carriers 110, 120, 180 may have lower and/or upper surfaces being coplanar with each other, respectively.

According to FIG. 10B, a bonding material 1010 may be deposited on the mounting surface 111 of the first carrier 110 and on the mounting surface 121 of the second carrier 120. The bonding material 1010 may, e.g., comprise or consist of solder, a soft solder, a diffusion solder, a paste, a nanopaste, or an electrically conductive adhesive. Depositing the bonding material 1010 on the first 110 and on the second carrier 120 may be performed in parallel, i.e. within one deposition step. It may also be performed in a batch process, i.e. for a plurality of semiconductor power devices 1000 which are manufactured in parallel.

More specifically, the bonding material 1010 may, e.g., be made of a soldering material such as, e.g., Au, Sn, AgSn, CuSn, AgIn, AuIn, CuIn, AuSi, Sn or Au, or by a paste containing metal particles distributed in a polymer material or resin such as, e.g., α-terpineol. Metal particles contained in a paste may, for example, be made of silver, gold, copper, tin or nickel. The extensions (average diameter) of the metal particles may, e.g., be smaller than 100 nm and, in particular, smaller than 50 nm. These pastes are also referred to as nanopastes in the art.

As shown in FIG. 10C, the first semiconductor power chip 130 is placed on the bonding material 1010 over the first carrier 110 and the second semiconductor power chip 140 is placed over the bonding material 1010 over the second carrier 120.

Referring to FIG. 10D, bonding material 1010 is deposited on the first surface 131 of the first semiconductor power chip 130 and on the first surface 141 of the second semiconductor power chip 140. Further, bonding material 1010 may be deposited on the fourth carrier 180. Depositing the bonding material 1010 on the fourth carrier 180 and on the first and second semiconductor power chips 130, 140 may be performed in parallel, i.e. within one deposition step. It may also be performed in a batch process, i.e. for a plurality of semiconductor power devices 1000 which are manufactured in parallel.

Referring to FIG. 10E, the contact clip 150 is placed over the bonding material 1010 deposited in FIG. 10D. Placing the contact clip 150 over the first semiconductor power chip 130 and over the second semiconductor power chip 140 may be performed in a batch process.

Referring to FIG. 10F, energy is applied in order to reflow, sinter or cure the bonding material 1010. The energy may be applied by heat, radiation, etc. By way of example, heat may be applied in an oven. By the application of energy the bonding material 1010, e.g. solder, metal paste, conductive adhesive, electrically and mechanically connects the first and second carriers 110, 120 to the first and second semiconductor power chips 130, 140, respectively, and the first and second semiconductor power chips 130, 140 to the contact clip 150 and, e.g., the fourth carrier 180 to the contact clip 150.

Referring to FIG. 10G, adhesive material 1020 is deposited on the mounting surface 152 of the contact clip 150. The adhesive material 1020 may, e.g., be identical to the bonding material 1010. The adhesive material 1020 may be electrically conducting or may be electrically insulating. Further, it is to be noted that the mounting surface 152 of the contact clip 150 may be coated by an insulating layer (not shown) as described above.

Referring to FIG. 10H, the third semiconductor chip 160 is placed on the adhesive material 1020. Further, additional semiconductor chips such as, e.g., the fourth semiconductor chip 660 (not shown) may be placed on the adhesive material 1020 at this stage of the process. Chip placement may be performed in parallel and, optionally, in a batch process.

Then, as illustrated in FIG. 10I, the adhesive material 1020 is transformed to bond the third semiconductor chip 160 (and, e.g., additional semiconductor chips, such as e.g., semiconductor chip 660) to the mounting surface 152 of the contact clip 150. The transformation may be caused by the application of energy, e.g. heat or radiation. If the adhesive material 1020 is a solder material similar to the bonding material 1010, the energy may be applied in a reflow process using, e.g., an oven. Otherwise, if the adhesive material 1020 is an insulating adhesive material, such as, e.g., a resin, the adhesive material 1020 may be cured by the application of energy.

Figure 11A:
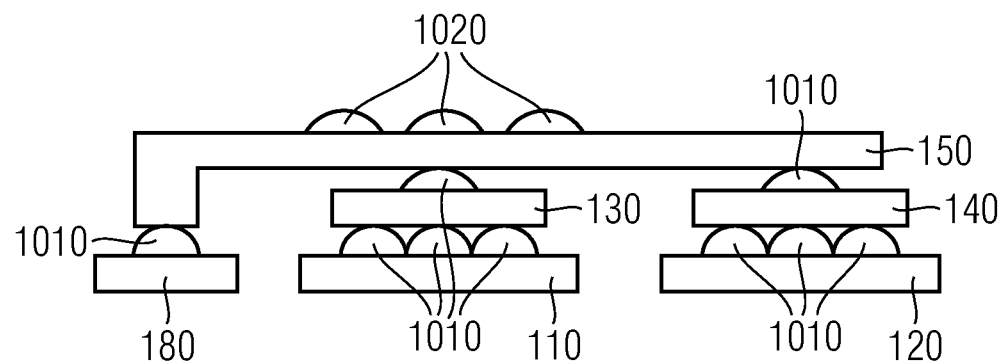
FIGS. 11A-11B schematically illustrate cross-sectional views of an exemplary process of a method of packaging a semiconductor chip.
Figure 11B:
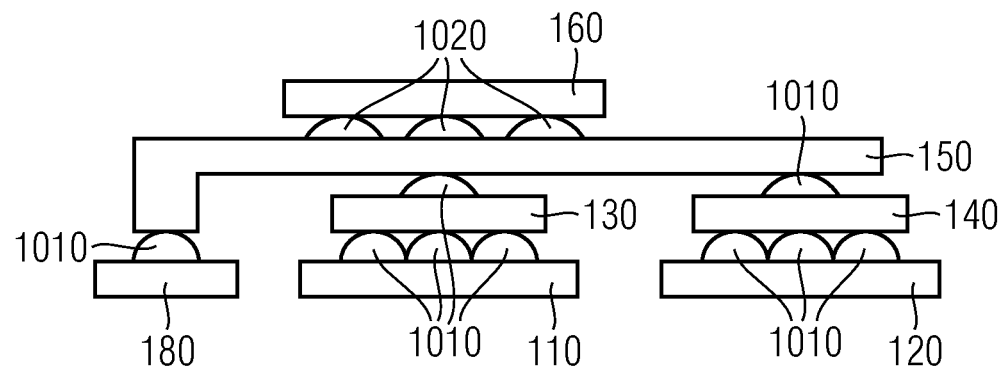

FIGS. 11A and 11B illustrate stages of a method of manufacturing a semiconductor device 1000 as illustrated in FIG. 10I. The processes illustrated, by way of example, in FIGS. 11A and 11B may be performed instead of the processes as shown in FIGS. 10E-10H.

More specifically, the first reflow process explained in conjunction with FIG. 10F is omitted. Instead, the adhesive material 1020 is placed on the mounting surface 152 of the contact clip 150 as explained above in conjunction with FIG. 10H.

Referring to FIG. 11B, the third semiconductor chip 160 (and, e.g., additional semiconductor chips such as, e.g., semiconductor chip 660) is placed on the adhesive material 1020.

Then, energy is applied to the arrangement shown in FIG. 11B to reflow or cure bonding material 1010 and to reflow or cure the adhesive material 1020. Thus, in accordance with the process stages illustrated in FIGS. 11A and 11B, only a single process of application of energy (e.g. heat and/or radiation) is needed in order to arrive at the semiconductor device 1000 as illustrated in FIG. 10I.

It is to be noted that the embodiments disclosed herein all implement the (at least) two plane build-up concept, i.e. the provision of a lower "power plane" and an upper "logic plane", wherein the planes are separated by a contact clip 150. Whilst the lower "power plane" may be located in the vicinity of carrier for efficient heat dissipation, the semiconductor chips 160, 660 of the "logic plane" may be located in an area within, e.g., the laterally outer outlines 132, 142 of the power semiconductor chips or, e.g., within the outline of the contact clip 150, thereby allowing to provide for a compact power semiconductor device package having a small footprint area and high thermal efficiency or robustness.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a first semiconductor power transistor chip having a first electrode on a first surface and a second electrode on an opposite second surface, the first semiconductor power transistor chip being mounted over a first carrier such that the second surface of the first semiconductor power transistor chip faces the first carrier and the second electrode is coupled to the first carrier;
a second semiconductor power transistor chip having a first electrode on a first surface and a second electrode on an opposite second surface, the second semiconductor power transistor chip being mounted over a second carrier such that the second surface of the second semiconductor power transistor chip faces the second carrier and the second electrode is coupled to the second carrier;
a contact clip mounted over the first semiconductor power transistor chip and over the second semiconductor power transistor chip such that the first surfaces of the first and second semiconductor power transistor chips face the contact clip and the first electrodes of the first and second semiconductor power transistor chips are coupled to the contact clip; and
a semiconductor logic chip mounted over the contact clip, wherein the first and second semiconductor power transistor chips are arranged side by side in a first plane, the semiconductor logic chip is arranged in a second plane above the first plane, and the contact clip is arranged between the first and second planes.

2. The semiconductor device of claim 1, wherein the contact clip has an extension in at least one lateral direction protruding beyond at least one of a laterally outer outline of the first semiconductor power chip and a laterally outer outline of the second semiconductor power chip.

3. The semiconductor device of claim 1, wherein the first carrier and the second carrier are coplanar.

4. The semiconductor device of claim 1, wherein the first carrier and the second carrier are chip pads of a leadframe.

5. A semiconductor device, comprising:
a first carrier having a mounting surface;
a first semiconductor power chip mounted over the mounting surface of the first carrier and having a first surface facing away from the first carrier;
a second carrier having a mounting surface;
a second semiconductor power chip mounted over the mounting surface of the second carrier and having a first surface facing away from the second carrier;
a third carrier having a mounting surface;
a connection element having a first surface connected to the first surface of the first semiconductor power chip, and a mounting surface facing away from the first surface; and
a third semiconductor chip mounted over the mounting surface of the connection element in a face-up orientation in which electrodes of the third semiconductor chip are disposed on a surface of the third semiconductor chip that is opposite the surface mounted to the connection element, and wherein the third semiconductor chip is a logic chip configured to control one or both of the first semiconductor power chip and the second semiconductor power chip,
wherein the first surface of the connection element is connected to the first surface of the second semiconductor power chip,
wherein the connection element has an extension in at least one lateral direction protruding beyond at least one of a laterally outer outline of the first semiconductor power chip and a laterally outer outline of the second semiconductor power chip,
wherein the connection element is mounted over the third carrier,
wherein the first, second and third carriers are coplanar.

6. The semiconductor device of claim 5, wherein the connection element is a contact clip.

7. The semiconductor device of claim 5, wherein the mounting surface of the first carrier and the mounting surface of the second carrier are coplanar.

8. The semiconductor device of claim 5, further comprising:
an insulating layer arranged between the mounting surface of the connection element and the third semiconductor chip, the insulating layer providing a dielectric strength of greater than 100V between the mounting surface of the connection element and the third semiconductor chip.

9. The semiconductor device of claim 5, wherein the first carrier and the second carrier are electrically disconnected from each other.

10. The semiconductor device of claim 5, wherein a surface of the first carrier opposite to the mounting surface of the first carrier or a surface of the second carrier opposite to the mounting surface of the second carrier forms a leadless package external contact area.

11. The semiconductor device of claim 5, wherein the semiconductor device is a DC-DC converter or an AC-DC converter.

12. The semiconductor device of claim 5, wherein exclusively power semiconductor chips are mounted over the mounting surfaces of the first and second carriers, and wherein exclusively semiconductor logic chips are mounted over the mounting surface of the connection element.

13. The semiconductor device of claim 5, wherein the first carrier and the second carrier are arranged side by side to each other.

14. The semiconductor device of claim 13, wherein the first semiconductor power chip has a source electrode connected to the mounting surface of the first carrier.

15. The semiconductor device of claim 5, further comprising:
    an external terminal pad arranged side by side to the first carrier or to the second carrier, wherein the connection element is connected to the external terminal pad.

16. The semiconductor device of claim 15, wherein the external terminal pad forms a leadless package external contact area.

* * * * *